US008797110B2

(12) United States Patent
Fan et al.

(10) Patent No.: US 8,797,110 B2
(45) Date of Patent: Aug. 5, 2014

(54) BUFFER INPUT IMPEDANCE COMPENSATION IN A REFERENCE CLOCK SIGNAL BUFFER

(75) Inventors: Bin Fan, San Diego, CA (US); Yiwu Tang, San Diego, CA (US); Kevin Hsi Huai Wang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 48 days.

(21) Appl. No.: 13/558,660

(22) Filed: Jul. 26, 2012

(65) Prior Publication Data
US 2014/0028411 A1    Jan. 30, 2014

(51) Int. Cl.
*H03B 5/32*    (2006.01)
(52) U.S. Cl.
USPC .............................. 331/158; 331/74; 333/32
(58) Field of Classification Search
USPC ......... 326/30; 331/74, 154, 158; 333/32, 124; 455/248.1
See application file for complete search history.

(56) References Cited

U.S. PATENT DOCUMENTS

| 5,387,824 | A * | 2/1995 | Michelsen | 326/83 |
| 6,166,570 | A * | 12/2000 | Hedberg | 327/108 |
| 6,242,942 | B1 * | 6/2001 | Shamarao | 326/27 |
| 6,366,129 | B1 * | 4/2002 | Douglas et al. | 326/86 |
| 6,515,501 | B2 * | 2/2003 | Bosnyak et al. | 326/30 |
| 6,567,318 | B2 * | 5/2003 | Bedarida et al. | 365/189.05 |
| 6,703,890 | B2 * | 3/2004 | Fukui | 327/534 |
| 7,295,077 | B2 * | 11/2007 | Thomsen et al. | 331/10 |
| 7,348,859 | B2 * | 3/2008 | Yamamoto | 331/61 |
| 7,688,105 | B2 * | 3/2010 | Wong | 326/30 |
| 7,792,512 | B2 | 9/2010 | Womac | |
| 7,978,009 | B2 | 7/2011 | Mu | |
| 8,536,951 | B2 * | 9/2013 | Sareen | 331/74 |
| 2003/0098749 | A1 * | 5/2003 | Terasawa et al. | 331/74 |
| 2005/0124303 | A1 | 6/2005 | Bengtson et al. | |
| 2005/0151576 | A1 | 7/2005 | Lee et al. | |
| 2009/0325527 | A1 | 12/2009 | Rabjohn | |
| 2010/0295629 | A1 | 11/2010 | Klemens et al. | |

OTHER PUBLICATIONS

International Search Report and Written Opinion—PCT/US2013/045375—ISA/EPO—Oct. 16, 2013.

* cited by examiner

*Primary Examiner* — Levi Gannon
(74) *Attorney, Agent, or Firm* — Kevin T. Cheatham

(57) ABSTRACT

A system for managing a reference clock signal includes an XO; a signal buffer coupled to the XO and configured to drive a reference clock signal generated by the XO; and a first IC coupled to the signal buffer. The first IC includes an XO input buffer configured to receive the reference clock signal, to switch between an enabled, operational state and a disabled state, and to have a first operational impedance while in the enabled state; an impedance equivalence circuit configured to be in an enabled, operational state when the XO input buffer is in its disabled state and vice versa and to have a second operational impedance while in the enabled state that is equivalent to the first operational impedance; and a control mechanism configured to switch the XO input buffer and the impedance equivalence circuit between the enabled state and the disabled state.

43 Claims, 15 Drawing Sheets

BUFFER INPUT IMPEDANCE COMPENSATION IN A REFERENCE CLOCK SIGNAL BUFFER

BACKGROUND

Advancements in wireless communication technology have greatly increased the versatility of today's wireless communication devices. These advancements have enabled wireless communication devices to evolve from simple mobile telephones and pagers into sophisticated computing devices capable of a wide variety of functionality such as multimedia recording and playback, event scheduling, word processing, e-commerce, etc. Further, wireless transceivers that once required large, unwieldy circuitry can now be implemented within a single, compact integrated circuit (IC) or semiconductor chip, enabling communication via many different radio access technologies (RATs) from a single device.

A power management integrated circuit (PMIC) is utilized in wireless communication devices to drive a reference clock signal generated by a crystal oscillator (XO) associated with the PMIC. Alternatively, the XO may drive the reference clock signal directly. The reference clock signal is referred to as an XO signal. The XO signal is provided from a buffer at the PMIC (or the XO itself, in the case of a directly driven XO signal) and received at an XO buffer at one or more ICs coupled to the PMIC.

A wireless communication device may employ a multichip configuration, in which there are two or more ICs that have an XO input buffer connected to the same off-chip XO driver at the PMIC. When an IC is in active operation, the XO input buffer of the IC conveys the XO input signal obtained from the PMIC to other components of the IC, such as a phase-locked loop (PLL) utilized for demodulation, frequency synthesis or other processing of wireless signals. Alternatively, an IC can be placed in an inactive mode whereby it does not utilize the XO input signal. When the XO input buffer at an IC is transitioned from the active mode to the inactive mode, or vice versa, the transition causes a change in the impedance of the buffer. This impedance change alters the input impedance seen by the PMIC buffer and, as a result, causes changes to the phase and/or delay of the XO input signal provided to each of the connected ICs.

SUMMARY

An example of a system for managing a reference clock signal is described herein. The system includes an XO, a signal buffer coupled to the XO and configured to drive a reference clock signal generated by the XO, and a first IC coupled to the signal buffer. The first IC includes an XO input buffer configured to receive the reference clock signal. The XO input buffer is configured to be in an enabled, operational state or to be in a disabled state, and the XO input buffer has a first operational impedance while in the enabled state. The first IC also includes an impedance equivalence circuit configured to be in an enabled, operational state when the XO input buffer is in its disabled state, and to be in a disabled state when the XO input buffer is in its enabled state. The impedance equivalence circuit has a second operational impedance while operating in the enabled state that is substantially equivalent to the first operational impedance. The first IC additionally includes a control mechanism coupled to the XO input buffer and the impedance equivalence circuit and configured to switch the XO input buffer and the impedance equivalence circuit between the enabled state and the disabled state.

Implementations of the system may include one or more of the following features. The impedance equivalence circuit is configured to consume less current in its enabled state than the XO input buffer is configured to consume in its enabled state. The impedance equivalence circuit is configured to consume at least ninety percent less current in its enabled state than the XO input buffer is configured to consume in its enabled state. The first operational impedance and the second operational impedance differ by no more than an input impedance variation tolerance associated with one or more ICs coupled to the signal buffer, the one or more ICs including the first IC. The input impedance variation tolerance is defined as a function of at least one of a local oscillator (LO) phase shift tolerance of the one or more ICs or a PLL tolerance of the one or more ICs. The input impedance variation tolerance is defined as a function of a number of ICs coupled to the signal buffer. The input impedance variation tolerance is defined such that operation of the impedance equivalence circuit in its enabled state results in no more than a tolerable phase shift of the reference clock signal. The tolerable phase shift of the reference clock signal is approximately 30 picoseconds. The tolerable phase shift of the reference clock signal is approximately 20 degrees.

Implementations of the method may additionally or alternatively include one or more of the following features. The first IC is configured to be in the enabled, operational state or in the disabled state, and the control mechanism is configured to place the XO input buffer in the disabled state and to place the impedance equivalence circuit in the operational state when the first IC enters the disabled state. A second IC coupled to the signal buffer, the second IC including a second XO input buffer, a second impedance equivalence circuit and a second control mechanism, where the second impedance equivalence circuit has an operational impedance substantially equivalent to an operational impedance of the second XO input buffer. The XO input buffer includes a first p-channel metal-oxide-semiconductor field-effect transistor (MOSFET), a first resistor coupled to the first p-channel MOSFET, and a first n-channel MOSFET coupled to the first resistor. The impedance equivalence circuit includes a second resistor, a second p-channel MOSFET coupled in parallel to the second resistor, a third resistor coupled to the second resistor, and a second n-channel MOSFET coupled in parallel to the third resistor, and the second p-channel MOSFET and the second n-channel MOSFET are disposed and configured with shorted sources and drains to cause the second p-channel MOSFET and the second n-channel MOSFET to operate as MOS capacitors. The first p-channel MOSFET and the second p-channel MOSFET have equal finger length and finger width, and the first n-channel MOSFET and the second n-channel MOSFET have equal finger length and finger width. The control mechanism includes at least one switch coupled to the XO input buffer and the impedance equivalence circuit. The at least one switch is configured to couple the XO input buffer to the signal buffer and decouple the impedance equivalence circuit from the signal buffer when the XO input buffer is in the enabled state and to decouple the XO input buffer from the signal buffer and couple the impedance equivalence circuit to the signal buffer when the XO input buffer is in the disabled state. The at least one switch is configured to couple the XO input buffer to a drive voltage and decouple the impedance equivalence circuit from the drive voltage when the XO input buffer is in the enabled state and to decouple the XO input buffer from the drive voltage and couple the impedance equivalence circuit to the drive voltage when the XO input buffer is in the disabled state. A PMIC that includes the signal buffer. The XO comprises the signal buffer.

An example of a system for regulating XO input impedance is described herein. The system includes an XO, a signal buffer coupled to the XO and configured to drive a reference clock signal generated by the XO, and a first IC coupled to the signal buffer. The first IC includes an XO input buffer configured to receive the reference clock signal. The XO input buffer is configured to be in an enabled, operational state or to be in a disabled state, and the XO input buffer has a first operational impedance while in the enabled state. The first IC also includes impedance compensation means for substantially equalizing an input impedance observed at the signal buffer with the first operational impedance while the XO input buffer is in the disabled state.

Implementations of the system may include one or more of the following features. The impedance compensation means includes means for operating in an enabled state when the XO input buffer is in its disabled state, where the impedance compensation means has a second operational impedance while in the enabled state that is substantially equivalent to the first operating impedance; and means for operating in an disabled state when the XO input buffer is in its operational state. The first operational impedance and the second operational impedance differ by no more than an input impedance variation tolerance associated with one or more ICs coupled to the signal buffer, the one or more ICs including the first IC. The input impedance variation tolerance is defined as a function of at least one of an LO phase shift tolerance of the one or more ICs or a PLL tolerance of the one or more ICs. The input impedance variation tolerance is defined as a function of a number of ICs coupled to the signal buffer. The input impedance variation tolerance is defined such that operation of the impedance compensation means in the enabled state results in no more than a tolerable phase shift of the reference clock signal. The tolerable phase shift of the reference clock signal is approximately 30 picoseconds. The tolerable phase shift of the reference clock signal is approximately 20 degrees.

Implementations of the system may additionally or alternatively include one or more of the following features. The impedance compensation means has a zero operational impedance while in the disabled state. The impedance compensation means is configured to consume less current in its enabled state than the XO input buffer is configured to consume in its enabled state. The impedance compensation means is configured to consume at least ninety percent less current in its enabled state than the XO input buffer is configured to consume in its enabled state. Control means, coupled to the XO input buffer and the impedance compensation means, for switching the XO input buffer and the impedance compensation means between the enabled state and the disabled state. The first IC is configured to be in the enabled, operational state or in the disabled state, and the control means includes means for placing the XO input buffer in the disabled state and placing the impedance compensation means in the enabled state when the first IC enters the disabled state. The control means includes means for coupling the XO input buffer to the signal buffer and decoupling the impedance compensation means from the signal buffer when the XO input buffer is in the enabled state; and means for decoupling the XO input buffer from the signal buffer and coupling the impedance compensation means to the signal buffer when the XO input buffer is in the disabled state. The control means includes means for coupling the XO input buffer to a drive voltage and decoupling the impedance compensation means from the drive voltage when the XO input buffer is in the enabled state; and means for decoupling the XO input buffer from the drive voltage and coupling the impedance compensation means to the drive voltage when the XO input buffer is in the disabled state. A PMIC that includes the signal buffer. The XO includes the signal buffer.

An example of a method of operating a wireless transceiver unit is described herein. The method includes supplying a source reference signal to an input of a first IC, the first IC including an input buffer that presents a first impedance at the input while the input buffer is in an enabled state, the input buffer being configured to be in the enabled state or in a disabled state; changing the state of the input buffer from the enabled state to the disabled state; and presenting a second impedance at the input while the input buffer is in the disabled state, where the second impedance is substantially equivalent to the first impedance.

Implementations of the method may include one or more of the following features. Presenting the second impedance includes consuming less current than the input buffer while in the enabled state. Presenting the second impedance at the input such that the first impedance and the second impedance differ by no more than an impedance variation tolerance associated with one or more ICs coupled to the input, the one or more ICs including the first IC. The impedance variation tolerance is defined as a function of at least one of a LO phase shift tolerance of the one or more ICs, a PLL tolerance of the one or more ICs, or a number of ICs coupled to the input. The impedance variation tolerance is defined such that presenting the second impedance at the input results in no more than a tolerable phase shift of the source reference signal. The tolerable phase shift of the source reference signal is approximately 30 picoseconds. The tolerable phase shift of the source reference signal is approximately 20 degrees. The presenting includes enabling an impedance equivalence structure of the first IC. The changing includes disabling the input buffer by setting a first control signal associated with the input buffer; and the presenting further includes enabling the impedance equivalence structure by setting a second control signal associated with the impedance equivalence structure. Obtaining the second control signal by inverting the first control signal. The changing includes disabling the input buffer by decoupling the input buffer from a drive voltage; and the presenting further includes enabling the impedance equivalence structure by coupling the impedance equivalence structure to the drive voltage. The changing includes disabling the input buffer by decoupling the input buffer from the input of the first IC; and the presenting further includes enabling the impedance equivalence structure by coupling the impedance equivalence structure to the input of the first IC.

An example of a computer program product described herein resides on a processor-executable computer storage medium and comprises processor-executable instructions. The instructions are configured to cause a processor to identify a first IC, the first IC comprising an input configured to receive a source reference signal and an input buffer that presents a first impedance at the input while the input buffer is in an enabled state, the input buffer being configured to be in the enabled state or in a disabled state; change the state of the input buffer from the enabled state to the disabled state; and configure a second impedance to be presented at the input in response to the input buffer being in the disabled state, wherein the second impedance is substantially equivalent to the first impedance.

Items and/or techniques described herein may provide one or more of the following capabilities, as well as other capabilities not mentioned. An XO input buffer associated with an IC can be disabled when placing the IC in a disabled mode, thereby yielding additional power savings associated with a disabled IC. The scalability of an XO signal driver is increased, enabling a single XO signal source to drive larger numbers of ICs than existing approaches with reduced pin usage and smaller overall circuit size. Impedance compensation is realized using similar electrical components to those utilized in existing XO input buffers, thereby minimizing manufacturing costs and enhancing manufacturing and operational consistency. Other capabilities may be provided and not every implementation according to the disclosure must provide any, let alone all, of the capabilities discussed. Further, it may be possible for an effect noted above to be achieved by means other than that noted, and a noted item/technique may not necessarily yield the noted effect.

DETAILED DESCRIPTION

Described herein are systems and methods for implementing input impedance compensation schemes. Such schemes may conserve battery life of a wireless communications device that utilizes multiple radio transceiver chips by reducing crystal oscillator (XO) sleep mode current consumption within the communication device. For example, each of several radio transceiver chips contains an input buffer operable to process an incoming reference clock signal. A circuit or structure is additionally disposed at each radio transceiver chip that, when enabled, mimics the impedance of the input buffer. This structure is enabled or disabled in a complementary manner to the input buffer, i.e., the structure is enabled when the input buffer is disabled, and vice versa. By doing so, the impedance of the radio transceiver chip is held approximately constant, thereby minimizing the effect of impedance changes on the reference clock signal, while reducing the amount of current consumed by the radio transceiver chip in relation to the current consumption of the input buffer.

Figure 1:
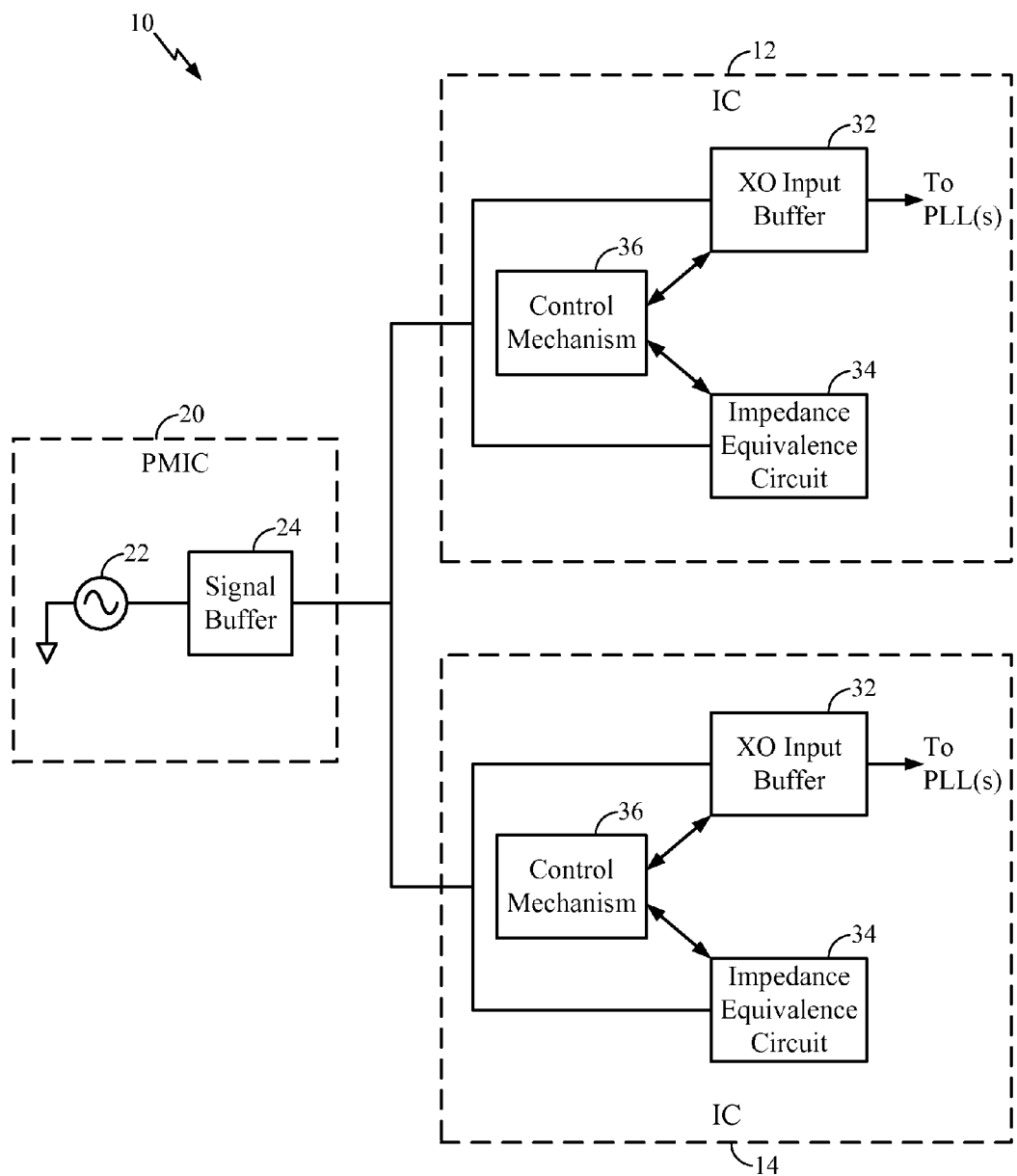
FIG. 1 is a block diagram of a system for input impedance compensation and buffer sleep current conservation in a multichip circuit.

Referring to FIG. 1, a system 10 includes a power management integrated circuit (PMIC) 20 that is communicatively coupled to a plurality of integrated circuits (ICs) 12, 14. The PMIC 20 includes a XO 22 that is configured to generate a reference clock signal (also referred to herein as an XO input signal or an XO signal). The reference clock signal is processed at a signal buffer 24 and provided from the signal buffer 24 to the coupled ICs 12, 14. Here, the signal buffer 24 is an amplifier with low output impedance and operates to amplify the strength of the reference clock signal in order to reduce degradation of the reference clock signal due to parasitic signal components and loading from subsequent stages of the system 10. While system 10 illustrates the XO 22 as part of a PMIC 20 that includes a separate signal buffer 24, the XO 22 could alternatively be a standalone component not associated with a PMIC. In the case of a standalone XO 22, the XO 22 itself performs buffering and/or other operations on the generated reference clock signal, including the operations of the signal buffer 24, such that the reference clock signal can be provided directly from the XO 22 to the ICs 12, 14.

The system 10 operates in a multichip configuration such that the PMIC 20 and the XO 22 drive a reference clock signal for multiple ICs, here two ICs 12, 14. While FIG. 1 illustrates only two ICs 12, 14, any number of ICs could be coupled to the PMIC 20. Each IC 12, 14 includes an XO input buffer 32 that process the incoming reference clock signal and provide the processed signal to one or more other components of the IC 12, 14. Similar to the signal buffer 24, the XO input buffer 32 is an amplifier with low output impedance that operates to amplify and reduce degradation of the reference clock signal. Here, ICs 12, 14 include radio frequency (RF) transceivers that operate on various radio access technologies (RATs) such as Code Division Multiple Access (CDMA), Global System for Mobile Communication (GSM), Wireless Local Area Network (WLAN) access technologies such as Wi-Fi, Personal Area Network (PAN) access technologies such as Bluetooth, etc. To this end, the XO input buffer 32 of each of the ICs 12, 14 buffers the reference clock signal provided by the PMIC 20 and the XO 22 and conveys the buffered clock signal to one or more other components of the ICs 12, 14, such as a phase-locked loop (PLL) utilized to track received signals in connection with demodulating and/or decoding the received signals. In addition, the ICs 12, 14 can include a local oscillator (LO), which generates a signal at a LO frequency through a PLL, a voltage-controlled oscillator (VCO) and divider circuit based on the reference clock signal. The LO frequency is chosen such that the LO signal can be mixed with signals received at radio frequency (RF) frequencies in order to produce a mixed signal at a frequency that can be more easily processed by the ICs 12, 14. The buffered clock signal can also be processed by multiplier and/or divider circuits or other mechanisms in order to generate clock signals of varying frequencies of integer or fractional ratios of the original reference clock signal (e.g., 2×, 3×, 3.5×, 4×, etc.) for use by respective components associated with the ICs 12, 14.

Figure 2:
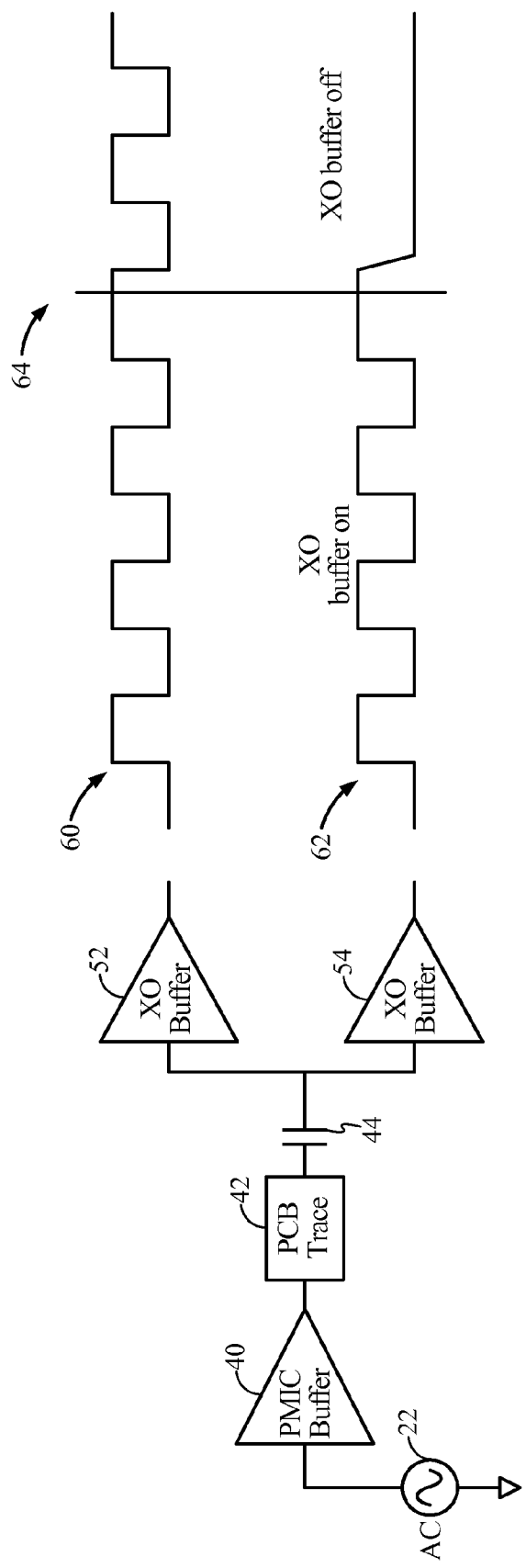
FIG. 2 is a diagram illustrating clock signal phase shifting caused by IC XO input buffer operating mode transitions.

Within a wireless communication device, various RATs can be enabled or disabled as desired. In other words, with reference to system 10, an IC 12, 14 corresponding to a given RAT can be placed in a disabled (or sleep) mode when the corresponding RAT is not in use by the device. Once in the disabled mode, the IC 12, 14 can be returned to an enabled mode (i.e., reactivated, woken up, etc.) when communication on the corresponding RAT is requested or anticipated. However, changing the operating status of an XO input buffer 32 of the IC 12, 14 between enabled and disabled operating modes conventionally results in inconsistencies in the operation of the system 10. For instance, FIG. 2 illustrates a PMIC buffer 40 that drives a clock signal produced by an XO 22 for two XO buffers 52, 54. A printed circuit board (PCB) trace 42 and a capacitor 44 facilitate the interconnection of the PMIC buffer 40 and the XO buffers 52, 54. The PCB trace 42 includes the reference clock wiring between the PMIC 20 and the ICs 12, 14 that facilitates the communication of signals between the PMIC 20 and ICs 12, 14. The capacitor 44 is a physical capacitor having a capacitance selected to isolate the direct current (DC) bias voltage between the PMIC buffer 40 and the XO buffers 52, 54. Graphs 60 and 62 show the clock signal waveform at the output of the respective XO buffers 52, 54 over time. At time 64, the second XO buffer 54 is disabled. As a result of disabling the second XO buffer 54, the clock signal observed at the first XO buffer 52 is shifted in phase.

In more general terms, instantaneous phase shifts in the XO reference signal are caused by enabling or disabling an XO buffer 52, 54. At RF frequencies, this phase shift ranges from approximately 5 degrees in the case of enabling or disabling an XO buffer 52, 54 (e.g., operating at about 824 MHz) to approximately 60 degrees in the case of enabling or disabling an NPLER (e.g., operating at about 2170 MHz), which is the series stage of the XO buffer 52, 54 utilized for generating different frequencies based on the reference clock signal. These phase changes result in performance issues such as demodulation failures for Global Positioning System (GPS) or Wide Area Network (WAN) reception and/or PLL locking failures, compliance issues such as violation of maximum phase shift between adjacent transmit slots, etc. Preferably, the tolerable phase change at LO frequencies caused by a reference clock phase change is smaller than approximately 30 ps at the XO 22. In contrast, the phase shift illustrated by FIG. 2 reaches approximately 80 ps when the second XO buffer 54 is switched on or off.

Figure 3:
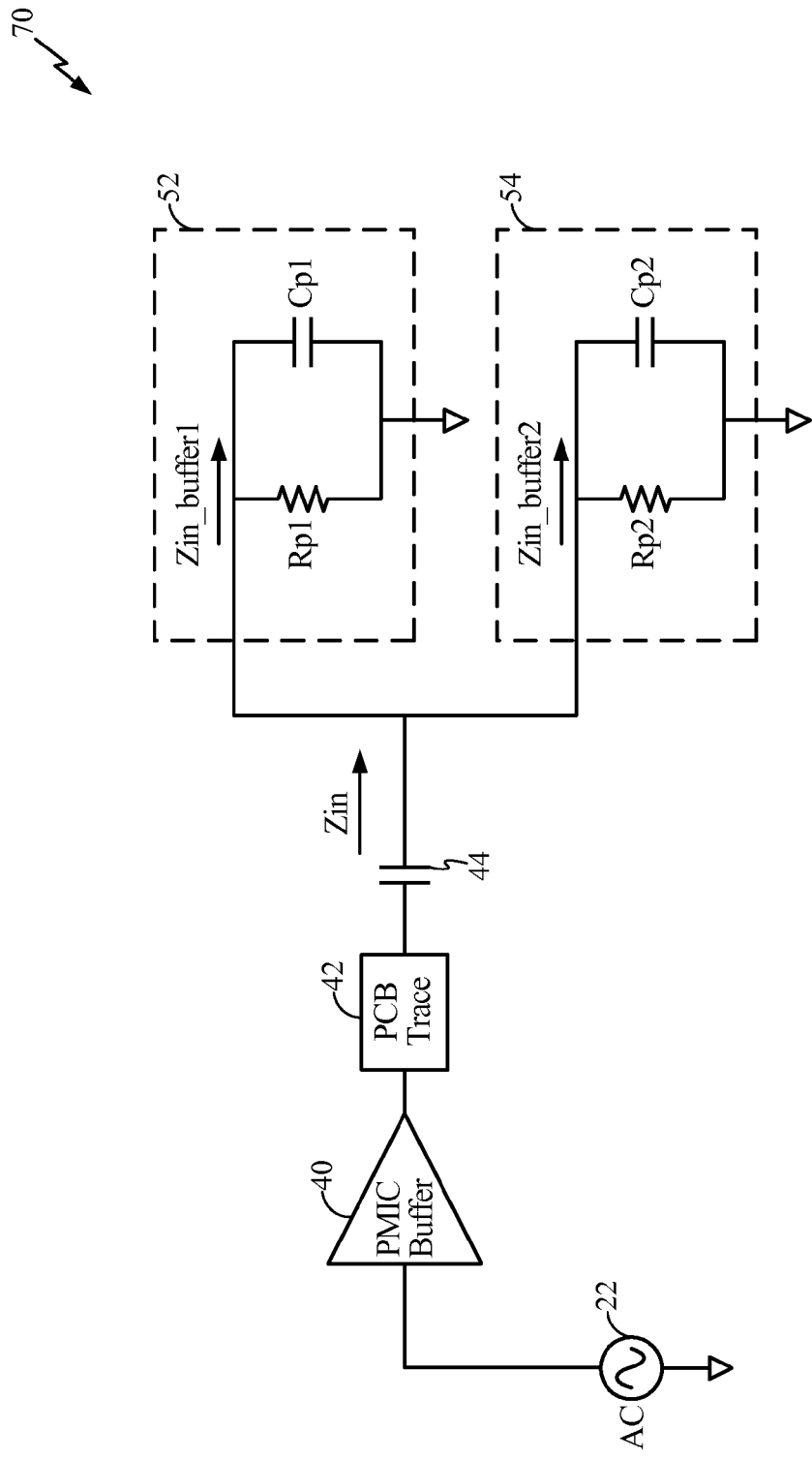
FIG. 3 is a circuit diagram illustrating equivalent impedance models of the XO input buffers shown in FIG. 2.

The phase shift of the XO signal shown in FIG. 2 is caused by the PMIC XO buffer 40 loading different input impedance when the connected XO buffers 52, 54 are switched on or off. System 70 in FIG. 3 illustrates simplified equivalent input impedance models of the XO buffers 52, 54. The input impedance of the XO buffers 52, 54 are represented by a resistive component Rp1, Rp2 and a capacitive component Cp1, Cp2. As system 70 shows, the overall input impedance Zin observed at the PMIC XO buffer 40 is expressed as Zin_buffer1||Zin_buffer2, where Zin_buffer1 and Zin_buffer2 represent the impedance of the XO buffers 52, 54, respectively. If either of the XO buffers 52, 54 are turned on or off, the input impedance of the switched buffer 52, 54 changes, in turn altering the overall input impedance Zin. Here, activating or inactivating the second XO buffer 54 causes Rp2 to change by approximately 46% and Cp2 to change by approximately 29%. These changes, combined with the alternating nature of the reference clock signal, cause changes in the loading conditions to the PMIC buffer 40. These changes, in turn, result in the phase of the reference clock signal being altered by approximately 80 ps, as noted above.

Figure 4:
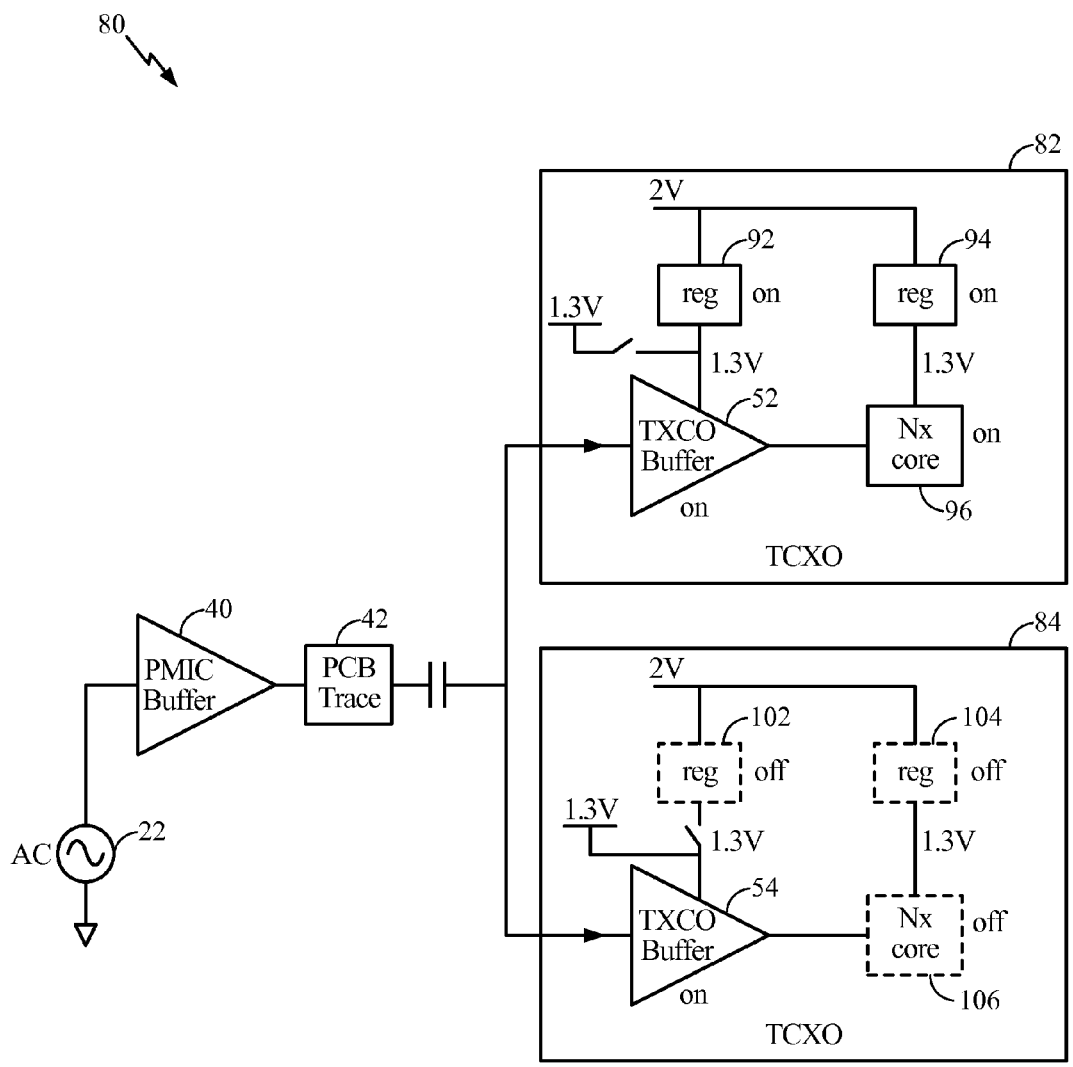
FIG. 4 is a block diagram illustrating a first IC operating in an enabled mode and a second IC operating in a sleep mode.

Conventionally, as shown by system 80 in FIG. 4, the input impedance changes caused by enabling and disabling an XO buffer 52, 54 are mitigated by keeping the XO buffers 52, 54 on at all times and instead disabling radio operation of a corresponding IC 82, 84 by bypassing the regulators of the IC and disabling the tripler of the IC to save current when the IC is to be put into a sleep mode. For instance, system 80 shows an enabled IC 82 with operational regulators 92, 94 and tripler (Nx core) 96 and a disabled IC 84 with bypassed regulators 102, 104 and tripler 106. In both the ICs 82, 84, the corresponding XO buffers 52, 54 remain enabled. In FIG. 4 and the illustrations that follow, disabled and/or bypassed components are drawn with broken lines, while enabled components are drawn with solid lines.

While the technique shown in FIG. 4 results in a reduced XO signal phase shift, leaving the XO buffers 52, 54 continuously enabled results in a large amount of current consumption even by ICs operating in a sleep mode. Here, the input buffer of IC 84 draws approximately 116 uA from an associated device battery when in sleep mode. Other ICs draw similar levels of current when in sleep mode.

Figure 5:
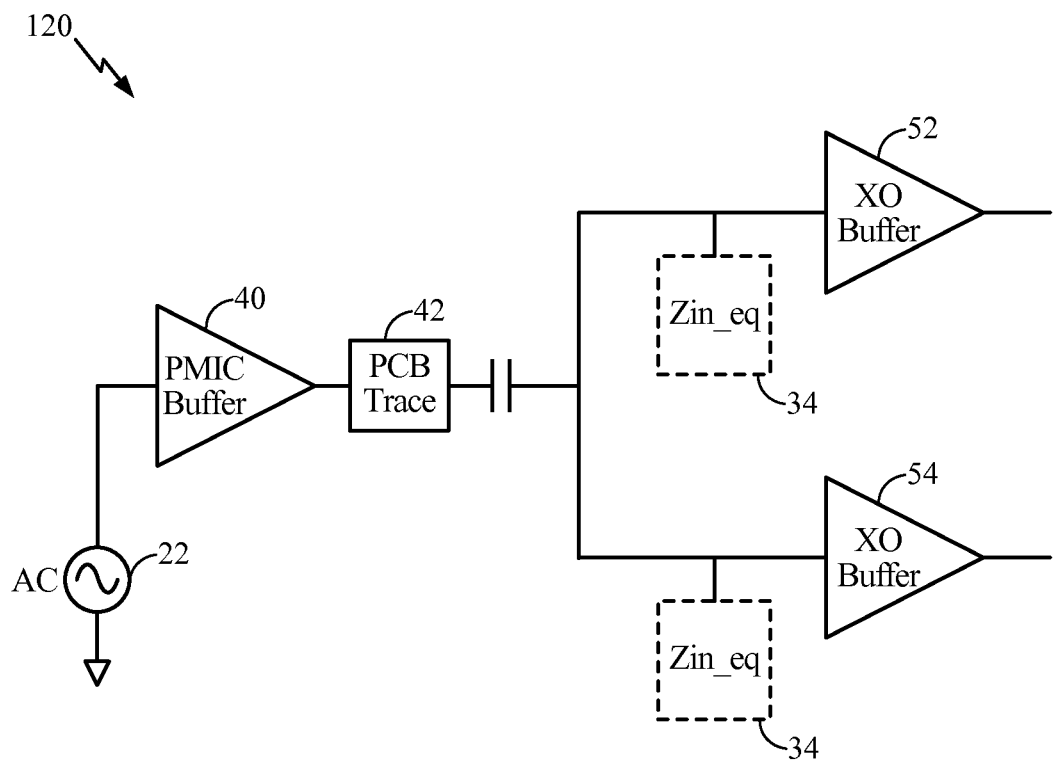
FIGS. 5-6 are block diagrams of a system for regulating the input impedance of the XO input buffers shown in FIG. 2 via equivalent impedance structures.
Figure 6:
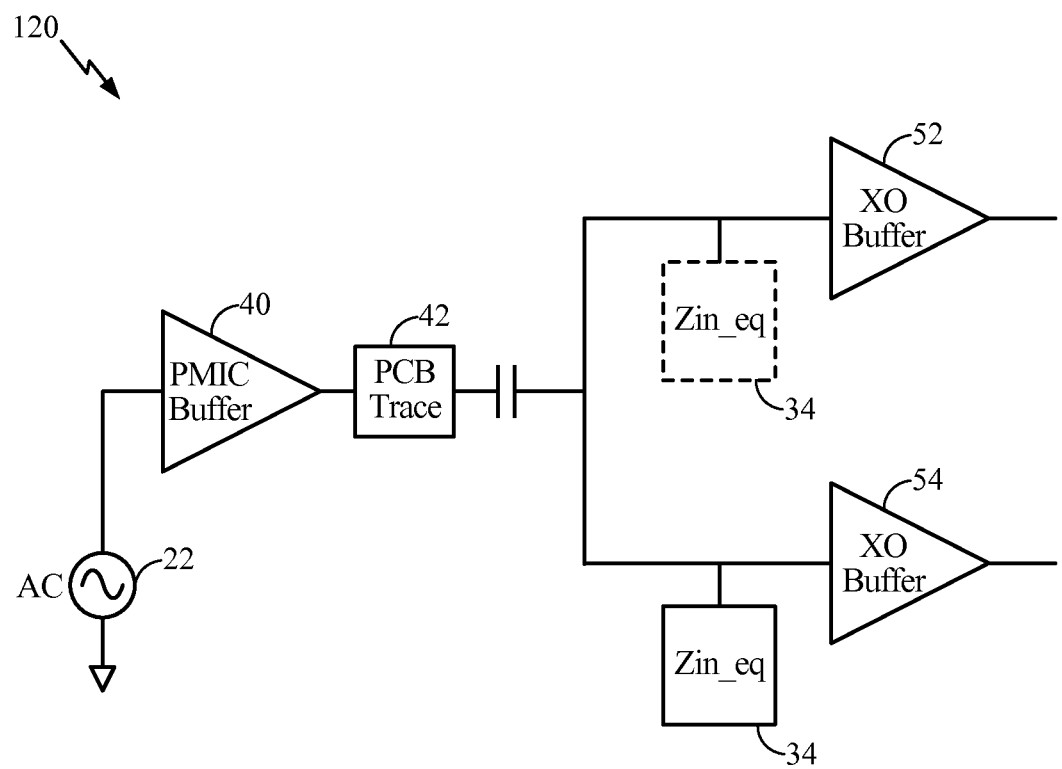

Returning to FIG. 1, to mitigate both the reference signal phase shift associated with disabling the input buffer 32 and the current draw associated with leaving the input buffer 32 enabled irrespective of the operating status of the underlying IC 12, 14, an impedance equivalence circuit 34 is incorporated at each IC 12, 14 to mitigate changes to observed input impedance when an IC 12, 14 is deactivated even when the XO buffer 32 at the IC 12, 14 is disabled. FIGS. 5 and 6 illustrate a system 120 that shows the operation of an impedance equivalence structure 34, labeled Zin_eq, for a two-chip configuration. At each chip of system 120, the impedance equivalence structure 34 and input buffer 52, 54 are complementarily enabled and disabled and have enabled input impedances that are substantially equivalent. In particular, FIG. 5 illustrates a state of system 120 in which both XO input buffers 52, 54 are enabled; correspondingly, both impedance equivalence structures 34 are disabled. In FIG. 6, the second XO input buffer 54 is disabled. To maintain the same input buffer impedance Zin between the enabled and disabled state of the second XO input buffer 54, the second impedance equivalence structure 34 is enabled. By operating the XO input buffers 52, 54 and impedance equivalence structures 34 in a complementary manner as shown by system 120, a substantially equivalent input buffer impedance is maintained between enabled and disabled states such that the loading to the PMIC XO buffer 40 is approximately the same, e.g., sufficiently similar such that a phase shift caused by a difference in the impedance observed at the PMIC XO buffer 40 falls within tolerable levels of any ICs coupled to the PMIC XO buffer 40.

As used above, "sufficiently similar" impedance is defined relative to a tolerance for input impedance variation as observed at the PMIC XO buffer 40 between an enabled XO input buffer 52, 54 and an enabled impedance equivalence structure 34. This tolerance is a function of the specifications of the ICs 12, 14 connected to the PMIC XO buffer 40 with respect to LO phase shift tolerance and/or PLL tolerance. For instance, for an example two-chip implementation such as that illustrated by FIGS. 5 and 6, activation of the impedance equivalence circuit 34 results in a resistance variation of no more than approximately 6% and a capacitive variation of no more than 8%. These tolerable variations will vary upward and/or downward based on the specification(s) of the specific ICs in use. Further, as the number of ICs coupled to the PMIC XO buffer 40 increases, the tolerable resistive and/or capacitive variation resulting from activation of the impedance equivalence circuit 34 may decrease for some implementations. Similarly, tolerable phase shift levels as discussed above are defined in relation to the specifications of the ICs 12, 14 connected to the PMIC XO buffer 40 with respect to tolerance in LO phase shift and/or PLL input impedance. Referring back to FIG. 2, an example impedance equivalence structure 34, upon activation, equalizes the input impedance observed by the PMIC XO buffer 40 such that the phase change observed within the waveform 60 at time 64 is less than 30 ps (i.e., less than approximately 9 degrees for an XO buffer operating at 824 MHz or less than approximately 20 degrees for an NPLER operating at approximately 2170 MHz).

Returning to FIG. 1, each IC 12, 14 additionally includes a control mechanism 36 that is communicatively coupled to the XO input buffer 32 and the impedance equivalence circuit 34 and configured to selectively enable or disable the XO input buffer 32 and impedance equivalence circuit 34. Here, the control mechanism 36 is implemented as one or more switches and facilitates the enabling and disabling of the XO input buffer 32 and impedance equivalence circuit 34 via selective coupling and decoupling of the reference clock signal from the signal buffer 24 to the XO input buffer 32 and impedance equivalence circuit 34, selective coupling of the XO input buffer 32 and impedance equivalence circuit 34 to a drive voltage signal and ground connection, etc. Example implementations of the control mechanism 36 are described in further detail below.

Figure 7:
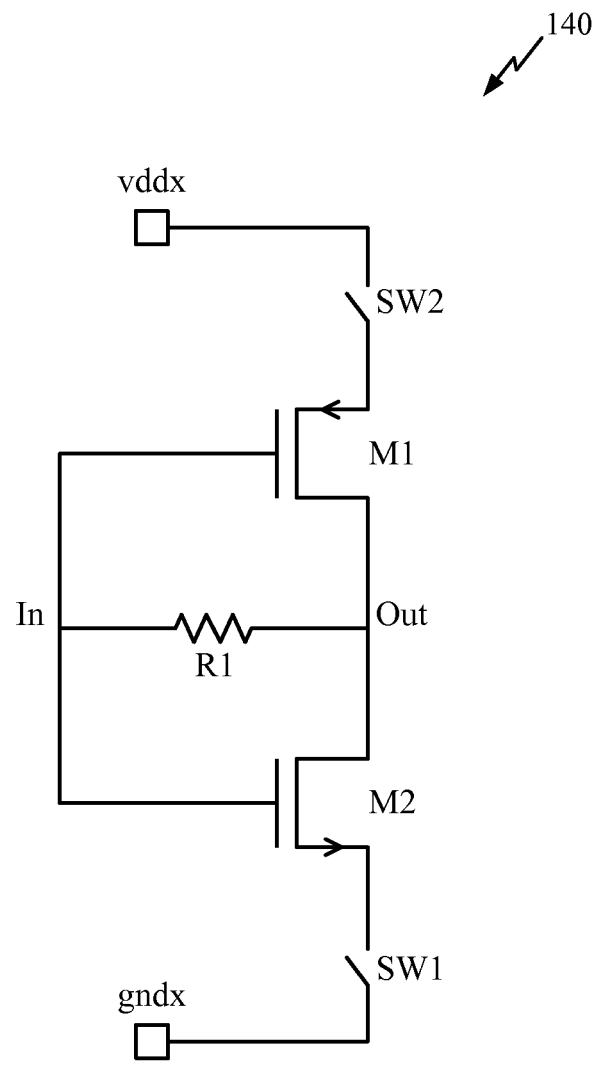
FIG. 7 is a circuit diagram of an XO input buffer.
Figure 8:
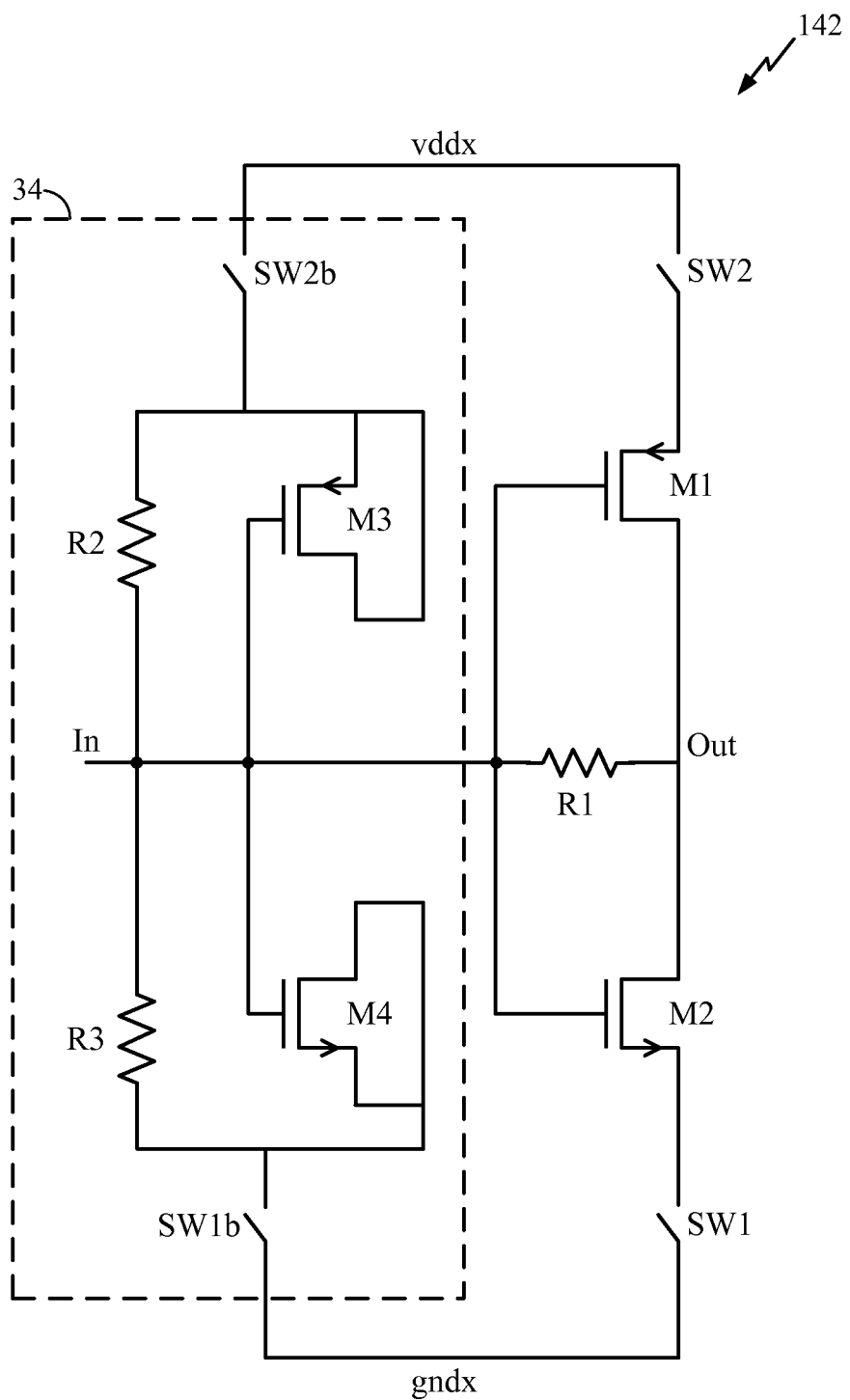
FIG. 8 is a circuit diagram of the XO input buffer shown in FIG. 7 with input impedance matching capability.

Referring next to FIGS. 7 and 8, a circuit implementation for an XO input buffer and impedance equivalence circuit 34 are illustrated. Circuit 140 in FIG. 7 illustrates an XO input buffer without an input matching circuit. The input buffer includes a p-channel metal-oxide-semiconductor field-effect transistor (MOSFET) M1, an n-channel MOSFET M2 and a resistor R1. An operational voltage Vddx is coupled to the source of MOSFET M1, and a ground Gndx is coupled to the source of MOSFET M2. An input node of the circuit 140 is coupled to the resistor R1 and the gates of MOSFETs M1 and M2. An output node of the circuit 140 is coupled to the resistor R1 and the drains of MOSFETs M1 and M2. The input buffer is enabled or disabled via switches SW1 and SW2. Switches SW1 and SW2 are controlled by a common control input source and are configurable in tandem in an open position, which obstructs the coupling between Vddx, M1, M2 and Gndx and disables the circuit 140, or a closed position, which provides little if any resistance to the coupling between Vddx, M1, M2 and Gndx and enables the circuit 140.

Circuit 142 in FIG. 8 illustrates an XO input buffer with an impedance equivalence circuit 34 coupled to the input buffer, which operates as described above. The impedance equivalence circuit 34 includes a p-channel MOSFET M3, an n-channel MOSFET M4 and resistors R2 and R3. MOSFETs M3 and M4 function as MOS capacitors, and the respective sources and drains of MOSFETs M3 and M4 are shorted. The operational voltage Vddx is provided to resistor R2 and the source of MOSFET M3, and the ground Gndx is provided to resistor R3 and the source of MOSFET M4. Here, to enable consistent manufacturing and operation of the circuit 142 over process and temperature, the same or similar structure (MOSFET type, finger width and length, etc.) is utilized by p-channel MOSFETs M1 and M3 and n-channel MOSFETs M2 and M4.

The impedance equivalence circuit 34 is enabled or disabled via switches SW1b and SW2b, which operate complementarily to switches SW1 and SW2. Here, a control signal provided to operate switches SW1 and SW2 is inverted, and the inverted control signal is used to operate switches SW1b and SW2b. Thus, switches SW1b and SW2b are configurable in tandem in an open position, which obstructs the coupling between Vddx, Gndx and the impedance equivalence circuit 34 and disables the impedance equivalence circuit 34, when switches SW1 and SW2 are in the closed position, or a closed position, which provides little if any resistance to the coupling between Vddx, Gndx and the impedance equivalence circuit 34 and enables the impedance equivalence circuit 34, when switches SW1 and SW2 are in the open position. While all switches are shown in circuit 142 as open for the purposes of illustration, the switches would operate in a complementary manner to enable either the input buffer circuit or the impedance equivalence circuit 34, as described above.

By utilizing the impedance equivalence circuit 34 as shown in FIG. 8, the current and power consumption of the circuit 142 is lowered when the underlying IC is disabled by allowing the XO input buffer of the IC to be disabled with the IC. The impedance equivalence circuit 34, when operational, is configured to consume an amount of current that is less than that an amount of current consumed by the XO input buffer when operational. Preferably, the impedance equivalence circuit 34 consumes an amount of current that is less than or equal to approximately ten percent of the current consumption of the XO input buffer. Here, the impedance equivalence circuit 34 consumes approximately 12 uA when enabled, resulting in a savings of approximately 116 uA per buffer disabled.

Figure 9:
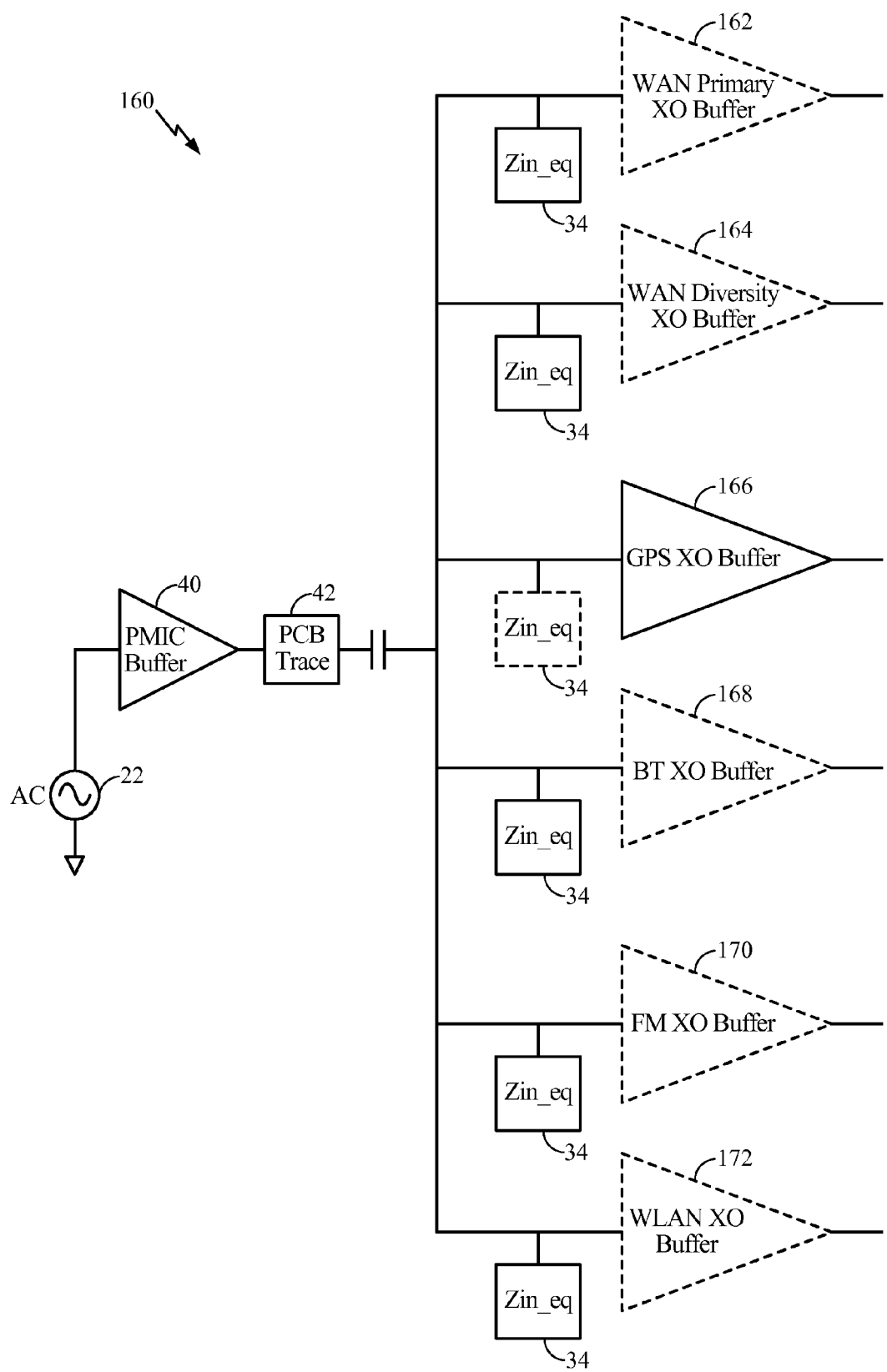
FIG. 9 is a block diagram of a multichip clock signal driver system employing equivalent impedance structures.

While various examples of the impedance equivalence circuit 34 given above are described in the context of a two-chip system, the impedance equivalence circuit 34 as described above enables greater scalability of a PMIC than that provided by existing structures. For instance, as shown in FIG. 9, impedance equivalence structures 34 are utilized in order to enable XO buffers 162, 164, 166, 168, 170, 172 associated with a WAN primary radio, a WAN diversity radio, GPS, Bluetooth, FM and WLAN, respectively, to share one programmable PMIC buffer 40 within a system 160. The configuration shown by system 160 saves pins on the PMIC side by enabling one PMIC buffer 40 and its associated set of pins (e.g., 2 pins) to be coupled to multiple ICs, as opposed to utilizing a distinct PMIC buffer 40 for each IC or smaller cluster of ICs. Further, the reduced current consumption associated with the impedance equivalence circuit 34 as described above further scales when utilized with an increased amount of XO buffers. For instance, in the GPS standalone mode illustrated by FIG. 9, disabling the remaining buffers and activating the corresponding impedance equivalence circuits results in a 0.58 mA reduction in the current usage of the system 160.

Figure 10:
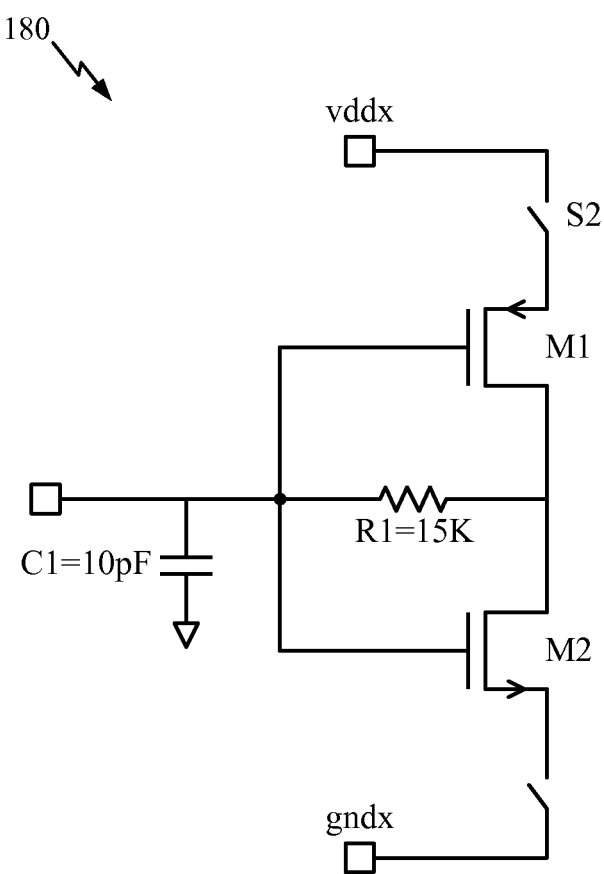
FIG. 10 is a circuit diagram of the XO input buffer shown in FIG. 7 with an input shunt capacitor.

In addition to the impedance equivalence structure 34 shown in FIG. 8, various alternatives could be utilized. Circuit 180 in FIG. 10 illustrates an alternative structure in which a shunt capacitor C1 is coupled to an input node of the XO input buffer. The capacitor C1 reduces the percentage capacitance change when the XO input buffer is enabled and disabled without substantially affecting the resistance changes. However, while the capacitor C1 reduces the phase shift of the XO reference signal, the capacitor C1 results in increased current draw at the PMIC. Here, the shunt capacitor C1 is 10 pF, resulting in an increased current consumption of approximately 346 uA at the PMIC.

Figure 11:
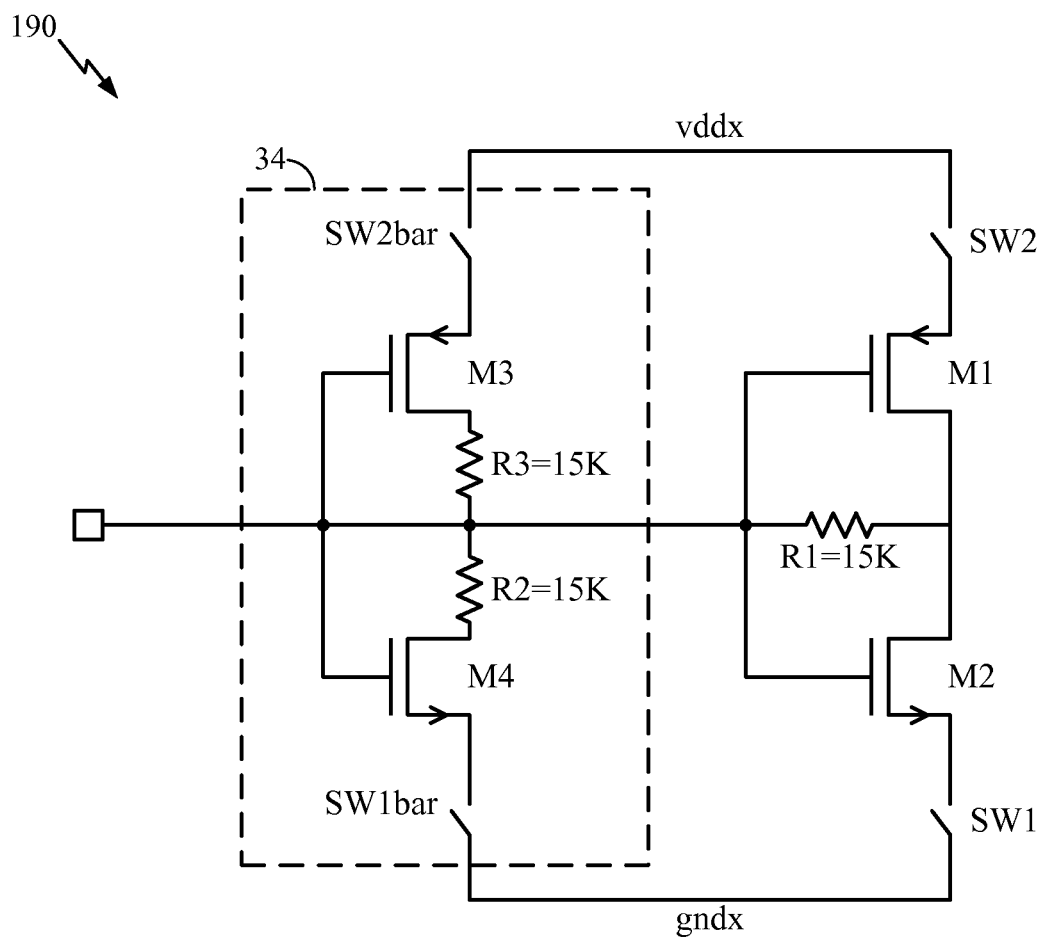
FIG. 11 is a circuit diagram of the XO input buffer shown in FIG. 7 with an alternate input impedance matching circuit structure.

Circuit 190 in FIG. 11 illustrates another alternate structure in which the impedance equivalence circuit 34 is constructed using an n-channel MOSFET M3, a p-channel MOSFET M4, and resistors R2 and R3 to dynamically mimic the impedance of the input buffer. The impedance equivalence circuit 34 shown in FIG. 11 consumes about 80 uA when enabled, resulting in a power savings of approximately forty percent when the input buffer is disabled.

Figure 12A:
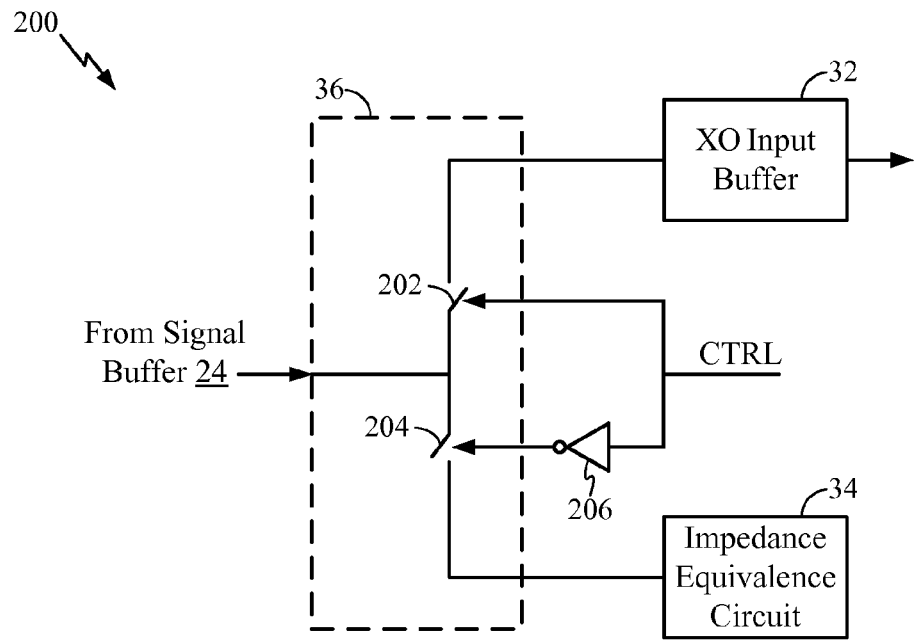
FIGS. 12A-12B are block diagrams of respective implementations of the control mechanism shown in FIG. 1.
Figure 12B:
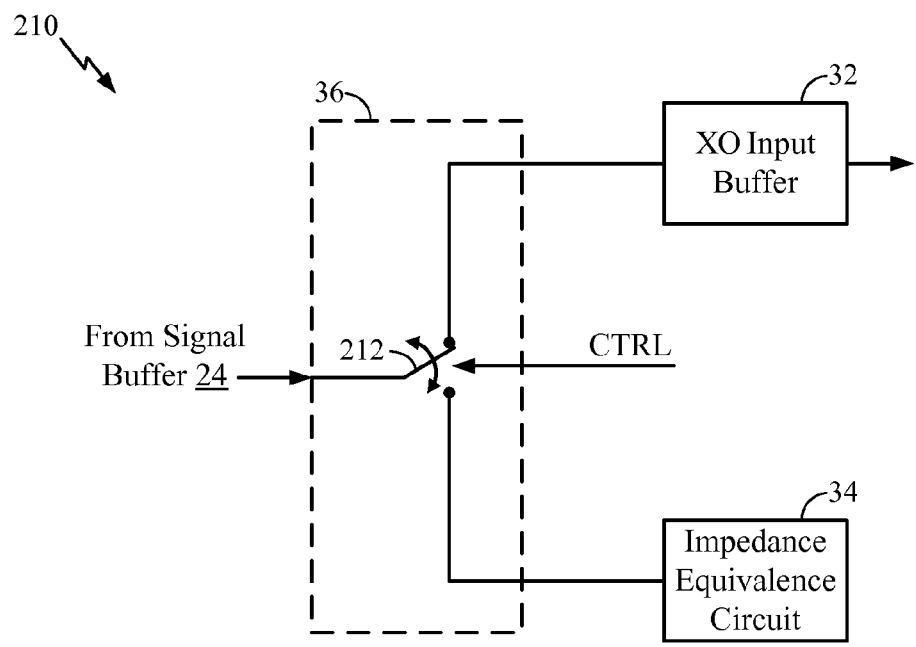
Figure 13:
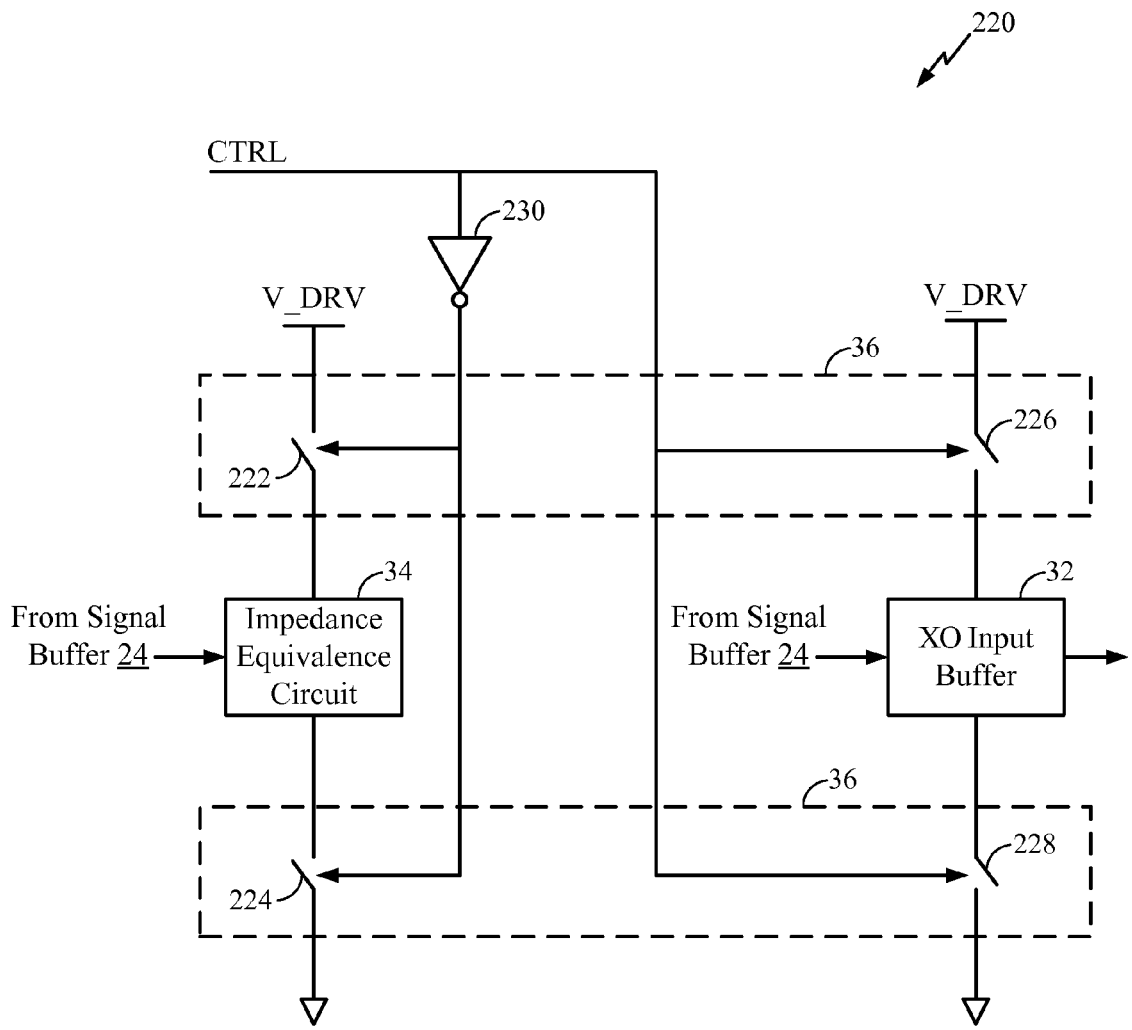
FIG. 13 is a block diagram of an additional implementation of the control mechanism shown in FIG. 1.

Within an IC 12, 14, the control mechanism 36 operates to switch the XO input buffer 32 and the impedance equivalence circuit 34 between an enabled, operational state and a disabled state. Here, the control mechanism 36 is implemented as one or more switches that are configured to selectively couple the XO input buffer 32 and impedance equivalence circuit 34 to the signal buffer 24 and/or a drive voltage source. FIGS. 12A and 12B illustrate respective systems 200, 210 for selectively coupling the XO input buffer 32 and the impedance equivalence circuit 34 to the signal buffer 24 via the control mechanism 36. In FIG. 12A, the control mechanism 36 includes a first switch 202 that selectively couples the XO input buffer 32 to the signal buffer 24 and a second switch 204 that selectively couples the impedance equivalence circuit 34 to the signal buffer 24. A control signal is applied to the switches 202, 204 to selectively enable and disable the XO input buffer 32 and impedance equivalence circuit 34 as described above. In order to enable complementary operation of the XO input buffer 32 and impedance equivalence circuit 34, the control signal is inverted by an inverter 206 prior to being provided to the switch 204. In FIG. 12B, selective coupling of the XO input buffer 32 and impedance equivalence circuit 34 to the signal buffer 24 is achieved via a single, two-way switch 212. FIG. 13 shows another system 220 in which the control mechanism 36 includes a first set of switches 222, 224 and a second set of switches 226, 228 that selectively couple the impedance equivalence circuit 34 and the XO input buffer 32, respectively, to a drive voltage and a ground connection. Similar to FIG. 12A, a control signal is provided to the switches 222, 224, 226, 228 to manage their operation, and an inverter 230 is applied to the control signal prior to the control signal being applied to the first set of switches 222, 224 in order to enforce complementary operation of the XO input buffer 32 and impedance equivalence circuit 34.

Systems and methods described herein operate via one or more mobile devices operating in a wireless communication system. These mobile devices can include, but are not limited to, personal digital assistants (PDAs), smartphones, computing devices such as laptops, desktops or tablet computers, automobile computing systems, etc., whether presently existing or developed in the future. As described above, the impedance equivalence structure or circuit is implemented in combination with a wireless transceiver, e.g., implemented as one or more ICs coupled to a PMIC. The wireless transceiver can support any wireless communication technology supported by the underlying mobile device or its associated communication system. These technologies can include, but are not limited to, Wi-Fi, CDMA, Wideband CDMA (WCDMA), Long Term Evolution (LTE), Bluetooth, etc., satellite positioning systems (SPSs) such as Global Positioning System (GPS), Glonass, Beidou, Galileo, etc., or any other technologies, whether presently existing or developed in the future.

Figure 14:
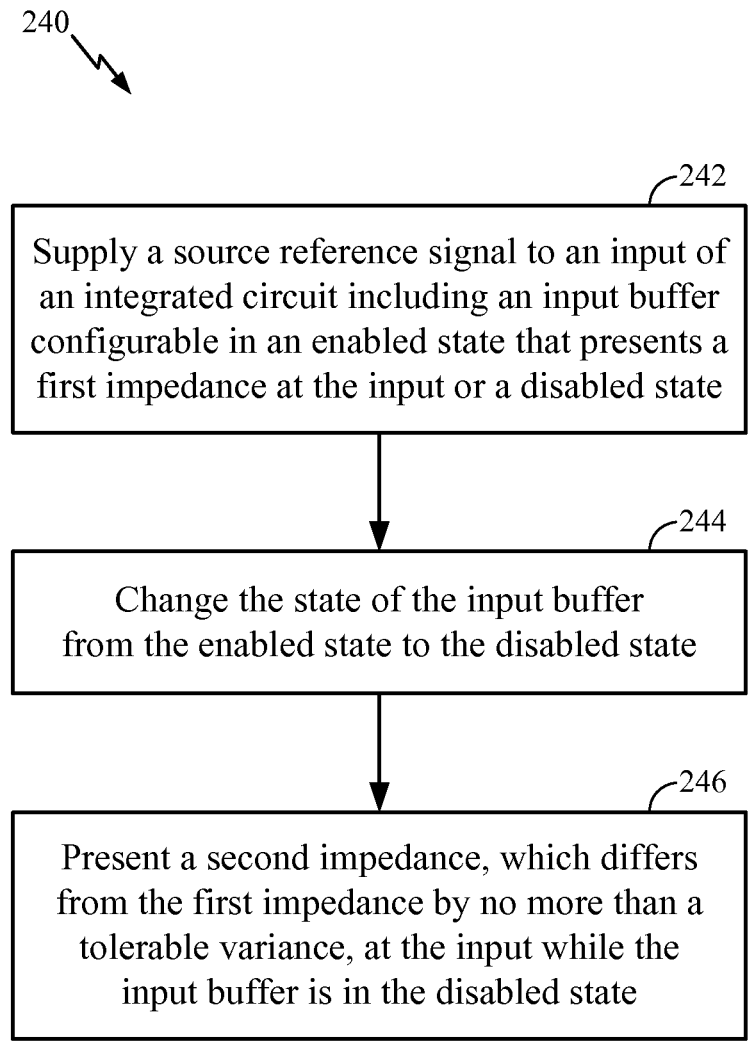
FIG. 14 is a block flow diagram of a process of operating a wireless transceiver unit.

Referring to FIG. 14, with further reference to FIGS. 1-13, a process 240 of operating a wireless transceiver unit includes the stages shown. The process 240 is, however, an example only and not limiting. The process 240 can be altered, e.g., by having stages added, removed, rearranged, combined, and/or performed concurrently. Still other alterations to the process 240 as shown and described are possible.

At stage 242, a source reference signal is supplied to an input of an integrated circuit 12, 14 including an input buffer 32 via a signal buffer 24. As described above, the input buffer 32 is configurable in an enabled state or a disabled state. In the enabled state, the input buffer 32 presents a first impedance at the input.

At stage 244, the state of the input buffer is changed from the enabled state to the disabled state. At stage 246, a second impedance, which differs from the first impedance by no more than a tolerable variance, is presented at the input while the input buffer is in the disabled state. This tolerable variance is defined relative to a tolerance for input impedance variation as observed at the input buffer and, as described above, is based on the operating characteristics (e.g., LO phase shift tolerance, PLL tolerance, etc.) of the IC(s) connected to the input. The tolerable variance between the first impedance and second impedance may also be defined based on a tolerable phase shift of the source reference signal caused by the variance between the first impedance and the second impedance. Here, the second impedance is chosen such that the phase shift of the source reference signal upon presenting the second impedance is less than 30 ps (e.g., approximately 9 degrees at 824 MHz or 20 degrees at 2170 MHz). Other metrics as described above could also be utilized.

As discussed above, the second impedance is provided by an impedance equivalence structure 34. The impedance equivalence structure 34 is constructed and configured such that the impedance equivalence structure 34, when operational, consumes less current (e.g., at least approximately forty percent less current and preferably at least approximately ninety percent less current) than that consumed by the input buffer 32 when the input buffer 32 is operational. Enabling and disabling the input buffer 32 and impedance equivalence structure 34 is performed by manipulating switches disposed on the IC 12, 14 and coupled to the input buffer 32 and impedance equivalence structure 34. More particularly, as shown by circuit 142 in FIG. 8, switches SW1 and SW2 are coupled to the input buffer 32 and switches SW1b and SW2b are coupled to the impedance equivalence structure 34. At stage 204, switches SW1 and SW2 are closed and switches SW1b and SW2b are opened, which provides coupling between the input buffer 32 and its connected components and inhibiting coupling between the impedance equivalence structure 34 and such components. At stage 206, switches SW1 and SW2 are opened and switches SW1b and SW2b are closed, providing coupling between the impedance equivalence structure 34 and its connected components and inhibiting coupling between the input buffer 32 and such components. The switches SW1, SW2 are operated by a first control signal, and the switches SW1b, SW2b are operated by a separate, second control signal or an inverter output of the first control signal. In an implementation in which an inverter is used, a buffer may be applied to the first control signal prior to being utilized by switches SW1, SW2 in order to account for inverter processing delay.

Figure 15:
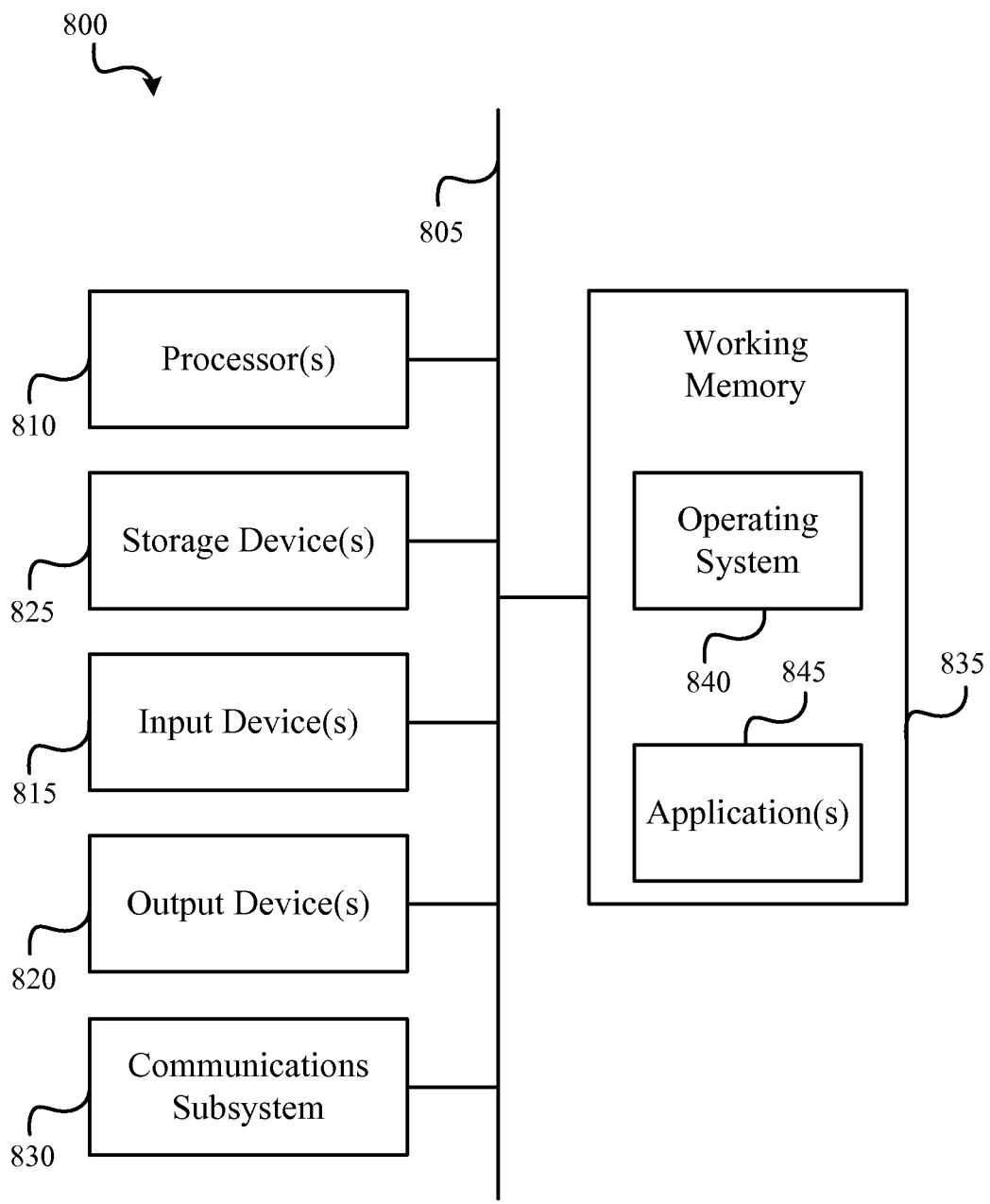
FIG. 15 is a block diagram of an example of a computer system.

A computer system 800 as illustrated in FIG. 15 may be utilized to at least partially implement the previously described functionality. For instance, the computer system 800 may be utilized to at least partially implement the techniques described above in software, e.g., as test software within a real or simulated environment, as software instructions executed by one or more ICs and/or processors, etc. In particular, the computer system 800 may be used to implement the process 240 illustrated by FIG. 14, and/or any other processes or techniques described herein, at least partially in software or a combination of software and hardware. FIG. 15 provides a schematic illustration of one embodiment of a computer system 800 that can perform the methods provided by various other embodiments, as described herein, and/or can function as a mobile device or other computer system. FIG. 15 provides a generalized illustration of various components, any or all of which may be utilized as appropriate. FIG. 15, therefore, broadly illustrates how individual system elements may be implemented in a relatively separated or relatively more integrated manner.

The computer system 800 is shown comprising hardware elements that can be electrically coupled via a bus 805 (or may otherwise be in communication, as appropriate). The hardware elements may include one or more processors 810, including without limitation one or more general-purpose processors and/or one or more special-purpose processors (such as digital signal processing chips, graphics acceleration processors, and/or the like); one or more input devices 815, which can include without limitation a mouse, a keyboard and/or the like; and one or more output devices 820, which can include without limitation a display device, a printer and/or the like. The processor(s) 810 can include, for example, intelligent hardware devices, e.g., a central processing unit (CPU) such as those made by Intel® Corporation or AMD®, a microcontroller, an ASIC, etc. Other processor types could also be utilized.

The computer system 800 may further include (and/or be in communication with) one or more non-transitory storage devices 825, which can comprise, without limitation, local and/or network accessible storage, and/or can include, without limitation, a disk drive, a drive array, an optical storage device, solid-state storage device such as a random access memory ("RAM") and/or a read-only memory ("ROM"), which can be programmable, flash-updateable and/or the like. Such storage devices may be configured to implement any appropriate data stores, including without limitation, various file systems, database structures, and/or the like.

The computer system 800 might also include a communications subsystem 830, which can include without limitation a modem, a network card (wireless or wired), an infrared communication device, a wireless communication device and/or chipset (such as a Bluetooth™ device, an 802.11 device, a WiFi device, a WiMax device, cellular communication facilities, etc.), and/or the like. The communications subsystem 830 may permit data to be exchanged with a network (such as the network described below, to name one example), other computer systems, and/or any other devices described herein. In many embodiments, the computer system 800 will further comprise, as here, a working memory 835, which can include a RAM or ROM device, as described above.

The computer system 800 also can comprise software elements, shown as being currently located within the working memory 835, including an operating system 840, device drivers, executable libraries, and/or other code, such as one or more application programs 845, which may comprise computer programs provided by various embodiments, and/or may be designed to implement methods, and/or configure systems, provided by other embodiments, as described herein. Merely by way of example, one or more processes described herein, such as process 240 shown in FIG. 14 and/or other processes, might be implemented as code and/or instructions executable by a computer (and/or a processor within a computer). Such code and/or instructions can be used to configure and/or adapt a general purpose computer (or other device) to perform one or more operations in accordance with the described methods.

A set of these instructions and/or code might be stored on a computer-readable storage medium, such as the storage device(s) 825 described above. In some cases, the storage medium might be incorporated within a computer system, such as the system 800. In other embodiments, the storage medium might be separate from a computer system (e.g., a removable medium, such as a compact disc), and/or provided in an installation package, such that the storage medium can be used to program, configure and/or adapt a general purpose computer with the instructions/code stored thereon. These instructions might take the form of executable code, which is executable by the computer system 800 and/or might take the form of source and/or installable code, which, upon compilation and/or installation on the computer system 800 (e.g., using any of a variety of generally available compilers, installation programs, compression/decompression utilities, etc.) then takes the form of executable code.

Substantial variations may be made in accordance with specific desires. For example, customized hardware might also be used, and/or particular elements might be implemented in hardware, software (including portable software, such as applets, etc.), or both. Further, connection to other computing devices such as network input/output devices may be employed.

A computer system (such as the computer system 800) may be used to perform methods in accordance with the disclosure. Some or all of the procedures of such methods may be performed by the computer system 800 in response to processor 810 executing one or more sequences of one or more instructions (which might be incorporated into the operating system 840 and/or other code, such as an application program 845) contained in the working memory 835. Such instructions may be read into the working memory 835 from another computer-readable medium, such as one or more of the storage device(s) 825. Merely by way of example, execution of the sequences of instructions contained in the working memory 835 might cause the processor(s) 810 to perform one or more procedures of the methods described herein.

The terms "machine-readable medium" and "computer-readable medium," as used herein, refer to any medium that participates in providing data that causes a machine to operate in a specific fashion. In an embodiment implemented using the computer system 800, various computer-readable media might be involved in providing instructions/code to processor(s) 810 for execution and/or might be used to store and/or carry such instructions/code (e.g., as signals). In many implementations, a computer-readable medium is a physical and/or tangible storage medium. Such a medium may take many forms, including but not limited to, non-volatile media, volatile media, and transmission media. Non-volatile media include, for example, optical and/or magnetic disks, such as the storage device(s) 825. Volatile media include, without limitation, dynamic memory, such as the working memory 835. Transmission media include, without limitation, coaxial cables, copper wire and fiber optics, including the wires that comprise the bus 805, as well as the various components of the communication subsystem 830 (and/or the media by which the communications subsystem 830 provides communication with other devices). Hence, transmission media can also take the form of waves (including without limitation radio, acoustic and/or light waves, such as those generated during radio-wave and infrared data communications).

Common forms of physical and/or tangible computer-readable media include, for example, a floppy disk, a flexible disk, hard disk, magnetic tape, or any other magnetic medium, a CD-ROM, a Blu-Ray disc, any other optical medium, punchcards, papertape, any other physical medium with patterns of holes, a RAM, a PROM, EPROM, a FLASH-EPROM, any other memory chip or cartridge, a carrier wave as described hereinafter, or any other medium from which a computer can read instructions and/or code.

Various forms of computer-readable media may be involved in carrying one or more sequences of one or more instructions to the processor(s) 810 for execution. Merely by way of example, the instructions may initially be carried on a magnetic disk and/or optical disc of a remote computer. A remote computer might load the instructions into its dynamic memory and send the instructions as signals over a transmission medium to be received and/or executed by the computer system 800. These signals, which might be in the form of electromagnetic signals, acoustic signals, optical signals and/or the like, are all examples of carrier waves on which instructions can be encoded, in accordance with various embodiments of the invention.

The communications subsystem 830 (and/or components thereof) generally will receive the signals, and the bus 805 then might carry the signals (and/or the data, instructions, etc. carried by the signals) to the working memory 835, from which the processor(s) 805 retrieves and executes the instructions. The instructions received by the working memory 835 may optionally be stored on a storage device 825 either before or after execution by the processor(s) 810.

The methods, systems, and devices discussed above are examples. Various alternative configurations may omit, substitute, or add various procedures or components as appropriate. For instance, in alternative methods, stages may be performed in orders different from the discussion above, and various stages may be added, omitted, or combined. Also, features described with respect to certain configurations may be combined in various other configurations. Different aspects and elements of the configurations may be combined in a similar manner. Also, technology evolves and, thus, many of the elements are examples and do not limit the scope of the disclosure or claims.

Specific details are given in the description to provide a thorough understanding of example configurations (including implementations). However, configurations may be practiced without these specific details. For example, well-known circuits, processes, algorithms, structures, and techniques have been shown without unnecessary detail in order to avoid obscuring the configurations. This description provides example configurations only, and does not limit the scope, applicability, or configurations of the claims. Rather, the preceding description of the configurations will provide those skilled in the art with an enabling description for implementing described techniques. Various changes may be made in the function and arrangement of elements without departing from the spirit or scope of the disclosure.

Configurations may be described as a process which is depicted as a flow diagram or block diagram. Although each may describe the operations as a sequential process, many of the operations can be performed in parallel or concurrently. In addition, the order of the operations may be rearranged. A process may have additional steps not included in the figure. Furthermore, examples of the methods may be implemented by hardware, software, firmware, middleware, microcode, hardware description languages, or any combination thereof. When implemented in software, firmware, middleware, or microcode, the program code or code segments to perform the necessary tasks may be stored in a non-transitory computer-readable medium such as a storage medium. Processors may perform the described tasks.

As used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C), or combinations with more than one feature (e.g., AA, AAB, ABBC, etc.).

Having described several example configurations, various modifications, alternative constructions, and equivalents may be used without departing from the spirit of the disclosure. For example, the above elements may be components of a larger system, wherein other rules may take precedence over or otherwise modify the application of the invention. Also, a number of steps may be undertaken before, during, or after the above elements are considered. Accordingly, the above description does not bound the scope of the claims.

What is claimed is:

1. A system for managing a reference clock signal, the system comprising:
    a crystal oscillator (XO);
    a signal buffer coupled to the XO and configured to drive a reference clock signal generated by the XO; and
    a first integrated circuit (IC) coupled to the signal buffer, the first IC comprising:
        an XO input buffer configured to receive the reference clock signal, wherein the XO input buffer is configured to be in an enabled, operational state or to be in a disabled state, and wherein the XO input buffer has a first operational impedance while in the enabled state;
        an impedance equivalence circuit configured to be in an enabled, operational state when the XO input buffer is in its disabled state, and to be in a disabled state when the XO input buffer is in its enabled state, wherein the impedance equivalence circuit has a second operational impedance while operating in the enabled state that is substantially equivalent to the first operational impedance, wherein the impedance equivalence circuit is configured to consume less current in its enabled state than the XO input buffer is configured to consume in its enabled state; and
        a control mechanism coupled to the XO input buffer and the impedance equivalence circuit and configured to switch the XO input buffer and the impedance equivalence circuit between the enabled state and the disabled state.

2. The system of claim 1 wherein the impedance equivalence circuit is configured to consume at least ninety percent less current in its enabled state than the XO input buffer is configured to consume in its enabled state.

3. The system of claim 1 wherein the first operational impedance and the second operational impedance differ by no more than an input impedance variation tolerance associated with one or more ICs coupled to the signal buffer, the one or more ICs including the first IC.

4. The system of claim 3 wherein the input impedance variation tolerance is defined as a function of at least one of a local oscillator (LO) phase shift tolerance of the one or more ICs or a phase-locked loop (PLL) tolerance of the one or more ICs.

5. The system of claim 3 wherein the input impedance variation tolerance is defined as a function of a number of ICs coupled to the signal buffer.

6. The system of claim 3 wherein the input impedance variation tolerance is defined such that operation of the impedance equivalence circuit in its enabled state results in no more than a tolerable phase shift of the reference clock signal.

7. The system of claim 6 wherein the tolerable phase shift of the reference clock signal is approximately 30 picoseconds.

8. The system of claim 6 wherein the tolerable phase shift of the reference clock signal is approximately 20 degrees.

9. The system of claim 1 wherein the first IC is configured to be in the enabled, operational state or in the disabled state, and wherein the control mechanism is configured to place the XO input buffer in the disabled state and to place the impedance equivalence circuit in the operational state when the first IC enters the disabled state.

10. The system of claim 1 further comprising a second IC coupled to the signal buffer, the second IC comprising a second XO input buffer, a second impedance equivalence circuit and a second control mechanism wherein the second impedance equivalence circuit has an operational impedance substantially equivalent to an operational impedance of the second XO input buffer.

11. The system of claim 1 wherein the XO input buffer comprises a first p-channel metal-oxide-semiconductor field-effect transistor (MOSFET), a first resistor coupled to the first p-channel MOSFET, and a first n-channel MOSFET coupled to the first resistor.

12. The system of claim 11 wherein the impedance equivalence circuit comprises a second resistor, a second p-channel MOSFET coupled in parallel to the second resistor, a third resistor coupled to the second resistor, and a second n-channel MOSFET coupled in parallel to the third resistor, and wherein the second p-channel MOSFET and the second n-channel MOSFET are disposed and configured with shorted sources and drains, thereby causing the second p-channel MOSFET and the second n-channel MOSFET to operate as MOS capacitors.

13. The system of claim 12 wherein:
the first p-channel MOSFET and the second p-channel MOSFET have equal finger length and finger width, and
the first n-channel MOSFET and the second n-channel MOSFET have equal finger length and finger width.

14. The system of claim 1 wherein the control mechanism comprises at least one switch coupled to the XO input buffer and the impedance equivalence circuit.

15. The system of claim 14 wherein the at least one switch is configured to couple the XO input buffer to the signal buffer and decouple the impedance equivalence circuit from the signal buffer when the XO input buffer is in the enabled state and to decouple the XO input buffer from the signal buffer and couple the impedance equivalence circuit to the signal buffer when the XO input buffer is in the disabled state.

16. The system of claim 14 wherein the at least one switch is configured to couple the XO input buffer to a drive voltage and decouple the impedance equivalence circuit from the drive voltage when the XO input buffer is in the enabled state and to decouple the XO input buffer from the drive voltage and couple the impedance equivalence circuit to the drive voltage when the XO input buffer is in the disabled state.

17. The system of claim 1 further comprising a power management integrated circuit (PMIC), wherein the PMIC comprises the signal buffer.

18. The system of claim 1 wherein the XO comprises the signal buffer.

19. A system for regulating crystal oscillator (XO) input impedance, the system comprising:
an XO;
a signal buffer coupled to the XO and configured to drive a reference clock signal generated by the XO; and
a first integrated circuit (IC) coupled to the signal buffer, the first IC comprising:
an XO input buffer configured to receive the reference clock signal, wherein the XO input buffer is configured to be in an enabled, operational state or to be in a disabled state, and wherein the XO input buffer has a first operational impedance while in the enabled state; and
impedance compensation means for substantially equalizing an input impedance observed at the signal buffer with the first operational impedance while the XO input buffer is in the disabled state, wherein the impedance compensation means is configured to consume less current in its enabled state than the XO input buffer is configured to consume in its enabled state.

20. The system of claim 19 wherein the impedance compensation means comprises:
means for operating in an enabled state when the XO input buffer is in its disabled state, wherein the impedance compensation means has a second operational impedance while in the enabled state that is substantially equivalent to the first operating impedance; and
means for operating in a disabled state when the XO input buffer is in its operational state.

21. The system of claim 20 wherein the first operational impedance and the second operational impedance differ by no more than an input impedance variation tolerance associated with one or more ICs coupled to the signal buffer, the one or more ICs including the first IC.

22. The system of claim 21 wherein the input impedance variation tolerance is defined as a function of at least one of a local oscillator (LO) phase shift tolerance of the one or more ICs or a phase-locked loop (PLL) tolerance of the one or more ICs.

23. The system of claim 21 wherein the input impedance variation tolerance is defined as a function of a number of ICs coupled to the signal buffer.

24. The system of claim 21 wherein the input impedance variation tolerance is defined such that operation of the impedance compensation means in the enabled state results in no more than a tolerable phase shift of the reference clock signal.

25. The system of claim 24 wherein the tolerable phase shift of the reference clock signal is approximately 30 picoseconds.

26. The system of claim 24 wherein the tolerable phase shift of the reference clock signal is approximately 20 degrees.

27. The system of claim 20 wherein the impedance compensation means has a zero operational impedance while in the disabled state.

28. The system of claim 20 wherein the impedance compensation means is configured to consume at least ninety percent less current in its enabled state than the XO input buffer is configured to consume in its enabled state.

29. The system of claim 20 wherein the first IC further comprises control means, coupled to the XO input buffer and the impedance compensation means, for switching the XO input buffer and the impedance compensation means between the enabled state and the disabled state.

30. The system of claim 29 wherein the first IC is configured to be in the enabled, operational state or in the disabled state, and wherein the control means comprises means for placing the XO input buffer in the disabled state and placing the impedance compensation means in the enabled state when the first IC enters the disabled state.

31. The system of claim 29 wherein the control means comprises:
means for coupling the XO input buffer to the signal buffer and decoupling the impedance compensation means from the signal buffer when the XO input buffer is in the enabled state; and
means for decoupling the XO input buffer from the signal buffer and coupling the impedance compensation means to the signal buffer when the XO input buffer is in the disabled state.

32. The system of claim 29 wherein the control means comprises:
means for coupling the XO input buffer to a drive voltage and decoupling the impedance compensation means from the drive voltage when the XO input buffer is in the enabled state; and
means for decoupling the XO input buffer from the drive voltage and coupling the impedance compensation means to the drive voltage when the XO input buffer is in the disabled state.

33. The system of claim 19 further comprising a power management integrated circuit (PMIC), wherein the PMIC comprises the signal buffer.

34. The system of claim 19 wherein the XO comprises the signal buffer.

35. A method of operating a wireless transceiver unit, the method comprising:
 supplying a source reference signal to an input of a first integrated circuit (IC), the first IC comprising an input buffer that presents a first impedance at the input while the input buffer is in an enabled state, the input buffer being configured to be in the enabled state or in a disabled state;
 changing the state of the input buffer from the enabled state to the disabled state and setting a first control signal associated with the input buffer;
 presenting a second impedance at the input while the input buffer is in the disabled state, wherein the second impedance is substantially equivalent to the first impedance and is configured to consume less current than the input buffer is configured to consume in its enabled state; and
 enabling an impedance equivalence structure of the first IC and setting a second control signal associated with the impedance equivalence structure wherein the second control signal is obtained by inverting the first control signal.

36. The method of claim 35 wherein presenting the second impedance comprises presenting the second impedance at the input such that the first impedance and the second impedance differ by no more than an impedance variation tolerance associated with one or more ICs coupled to the input, the one or more ICs including the first IC.

37. The method of claim 36 wherein the impedance variation tolerance is defined as a function of at least one of a local oscillator (LO) phase shift tolerance of the one or more ICs, a phase-locked loop (PLL) tolerance of the one or more ICs, or a number of ICs coupled to the input.

38. The method of claim 36 wherein the impedance variation tolerance is defined such that presenting the second impedance at the input results in no more than a tolerable phase shift of the source reference signal.

39. The method of claim 38 wherein the tolerable phase shift of the source reference signal is approximately 30 picoseconds.

40. The method of claim 38 wherein the tolerable phase shift of the source reference signal is approximately 20 degrees.

41. The method of claim 35 wherein:
 the changing comprises disabling the input buffer by decoupling the input buffer from a drive voltage; and
 the presenting further comprises enabling the impedance equivalence structure by coupling the impedance equivalence structure to the drive voltage.

42. The method of claim 35 wherein:
 the changing comprises disabling the input buffer by decoupling the input buffer from the input of the first IC; and
 the presenting further comprises enabling the impedance equivalence structure by coupling the impedance equivalence structure to the input of the first IC.

43. A non-transitory computer program product residing on a processor-executable computer storage medium, the computer program product comprising processor-executable instructions configured to cause a processor to:
 identify a first integrated circuit (IC), the first IC comprising an input configured to receive a source reference signal and an input buffer that presents a first impedance at the input while the input buffer is in an enabled state, the input buffer being configured to be in the enabled state or in a disabled state;
 change the state of the input buffer from the enabled state to the disabled state and set a first control signal associated with the input buffer;
 configure a second impedance to be presented at the input in response to the input buffer being in the disabled state, wherein the second impedance is substantially equivalent to the first impedance and is configured to consume less current than the input buffer is configured to consume in its enabled state; and
 enable an impedance equivalence structure of the first IC and set a second control signal associated with the impedance equivalence structure wherein the second control signal is obtained by inverting the first control signal.

* * * * *